US009449957B2

(12) United States Patent
Fernando et al.

(10) Patent No.: US 9,449,957 B2
(45) Date of Patent: Sep. 20, 2016

(54) CONTROL AND DRIVER CIRCUITS ON A POWER QUAD FLAT NO-LEAD (PQFN) LEADFRAME

(71) Applicant: Infineon Technologies Americas Corp., El Segundo, CA (US)

(72) Inventors: Dean Fernando, Torrance, CA (US); Roel Barbosa, Sta. Rosa Laguna (PH); Toshio Takahashi, Rancho Palos Verdes, CA (US)

(73) Assignee: Infineon Technologies Americas Corp., El Segundo, CA (US)

( * ) Notice: Subject to any disclaimer, the term of this patent is extended or adjusted under 35 U.S.C. 154(b) by 140 days.

(21) Appl. No.: 14/150,469

(22) Filed: Jan. 8, 2014

(65) Prior Publication Data

US 2014/0117518 A1    May 1, 2014

Related U.S. Application Data

(63) Continuation-in-part of application No. 13/662,244, filed on Oct. 26, 2012, now Pat. No. 9,324,638, which is a continuation of application No. 13/034,519, filed on Feb. 24, 2011, now Pat. No. 8,587,101.

(60) Provisional application No. 61/777,753, filed on Mar. 12, 2013, provisional application No. 61/459,527, filed on Dec. 13, 2010.

(51) Int. Cl.
*H01L 25/18* (2006.01)
*H01L 23/495* (2006.01)
(Continued)

(52) U.S. Cl.
CPC .......... *H01L 25/18* (2013.01); *H01L 23/4952* (2013.01); *H01L 23/49513* (2013.01);
(Continued)

(58) Field of Classification Search
CPC .......... H01L 23/495; H01L 23/49575; H01L 25/18; H01L 27/088
See application file for complete search history.

(56) References Cited

U.S. PATENT DOCUMENTS

| 5,773,883 A | 6/1998 | Majumdar |
| 5,998,856 A | 12/1999 | Noda |

(Continued)

FOREIGN PATENT DOCUMENTS

| CN | 102569241 | 7/2012 |
| EP | 2 463 904 | 6/2012 |

(Continued)

OTHER PUBLICATIONS

U.S. Appl. No. 61/459,527, filed Dec. 13, 2010, Fernando.
(Continued)

*Primary Examiner* — Peniel M Gumedzoe
(74) *Attorney, Agent, or Firm* — Shumaker & Sieffert, P.A.

(57) ABSTRACT

According to an exemplary implementation, a power quad flat no-lead (PQFN) leadframe includes U-phase and W-phase power switches situated on the PQFN leadframe and respectively connected to a U-phase output strip and a W-phase output pad of the PQFN leadframe. The PQFN leadframe further includes a common integrated circuit (IC) including a driver circuit and a control circuit where the common IC is connected to the U-phase output strip and to the W-phase output pad of the PQFN leadframe. The PQFN leadframe can also include a V-phase power switch situated on the PQFN leadframe where the V-phase power switch is connected to a V-phase output strip of the PQFN leadframe.

23 Claims, 6 Drawing Sheets (Top View)

(51) Int. Cl.
  *H01L 23/31* (2006.01)
  *H01L 23/00* (2006.01)
(52) U.S. Cl.
  CPC ... *H01L23/49541* (2013.01); *H01L 23/49548* (2013.01); *H01L 23/49562* (2013.01); *H01L 23/49575* (2013.01); H01L 23/3107 (2013.01); H01L 24/29 (2013.01); H01L 24/32 (2013.01); H01L 24/45 (2013.01); H01L 24/48 (2013.01); H01L 24/49 (2013.01); H01L 24/73 (2013.01); H01L 2224/05554 (2013.01); H01L 2224/0603 (2013.01); H01L 2224/2929 (2013.01); H01L 2224/29101 (2013.01); H01L 2224/29339 (2013.01); H01L 2224/32245 (2013.01); H01L 2224/45015 (2013.01); H01L 2224/45144 (2013.01); H01L 2224/45147 (2013.01); H01L 2224/48091 (2013.01); H01L 2224/48137 (2013.01); H01L 2224/48247 (2013.01); H01L 2224/4903 (2013.01); H01L 2224/49111 (2013.01); H01L 2224/49171 (2013.01); H01L 2224/73265 (2013.01); H01L 2924/014 (2013.01); H01L 2924/0105 (2013.01); H01L 2924/01005 (2013.01); H01L 2924/01006 (2013.01); H01L 2924/01029 (2013.01); H01L 2924/01033 (2013.01); H01L 2924/01047 (2013.01); H01L 2924/01079 (2013.01); H01L 2924/01082 (2013.01); H01L 2924/1305 (2013.01); H01L 2924/13055 (2013.01); H01L 2924/13064 (2013.01); H01L 2924/13091 (2013.01); H01L 2924/3011 (2013.01); H01L 2924/30111 (2013.01)

(56) References Cited

U.S. PATENT DOCUMENTS

| | | | |
|---|---|---|---|
| 6,137,165 A | 10/2000 | Thierry | |
| 6,211,549 B1 | 4/2001 | Funaki | |
| 6,249,024 B1 | 6/2001 | Mangtani | |
| 6,313,598 B1 | 11/2001 | Tamba | |
| 6,465,875 B2 | 10/2002 | Connah | |
| 6,610,923 B1 | 8/2003 | Nagashima | |
| 8,803,499 B2 | 8/2014 | Sreenivas | |
| 2001/0045627 A1 | 11/2001 | Connah | |
| 2002/0109211 A1 | 8/2002 | Shinohara | |
| 2002/0113617 A1 | 8/2002 | Gergintschw | |
| 2003/0006434 A1 | 1/2003 | Kawafuji et al. | |
| 2003/0107120 A1 | 6/2003 | Connah | |
| 2004/0135248 A1 | 7/2004 | Takagawa | |
| 2004/0196678 A1 | 10/2004 | Yoshimura | |
| 2004/0227476 A1 | 11/2004 | Guerra | |
| 2004/0227547 A1 | 11/2004 | Shiraishi | |
| 2005/0054186 A1 | 3/2005 | Kim | |
| 2006/0001318 A1 | 1/2006 | Ahmad | |
| 2006/0043545 A1 | 3/2006 | Yea | |
| 2006/0113664 A1 | 6/2006 | Shiraishi | |
| 2006/0240599 A1 | 10/2006 | Amano | |
| 2007/0064370 A1 | 3/2007 | Kajiwara | |
| 2007/0116553 A1 | 5/2007 | Chen | |
| 2007/0126092 A1 | 6/2007 | San Antonio | |
| 2007/0200537 A1 | 8/2007 | Akiyama | |
| 2007/0216011 A1 | 9/2007 | Otremba | |
| 2007/0228534 A1 | 10/2007 | Uno | |
| 2008/0002445 A1 | 1/2008 | Cho | |
| 2008/0023831 A1 | 1/2008 | Nishimura | |
| 2008/0074068 A1 | 3/2008 | Takeuchi | |
| 2008/0150436 A1 | 6/2008 | Suzuki | |
| 2008/0217662 A1 | 9/2008 | Harnden | |
| 2008/0224323 A1 | 9/2008 | Otremba | |
| 2008/0252372 A1 | 10/2008 | Williams | |
| 2009/0095979 A1 | 4/2009 | Saito | |
| 2009/0212733 A1 | 8/2009 | Hsieh | |
| 2009/0262468 A1 | 10/2009 | Ide | |
| 2009/0321927 A1 | 12/2009 | Nishimura | |
| 2010/0059875 A1 | 3/2010 | Sato | |
| 2010/0127683 A1 | 5/2010 | Uno | |
| 2010/0148590 A1 | 6/2010 | Kojima | |
| 2010/0164419 A1 | 7/2010 | Suh | |
| 2010/0165681 A1* | 7/2010 | Sakano | H03K 17/6877 363/123 |
| 2010/0301464 A1 | 12/2010 | Arshad | |
| 2011/0049685 A1 | 3/2011 | Park | |
| 2011/0110011 A1 | 5/2011 | Dittfeld | |
| 2011/0169102 A1 | 7/2011 | Uno | |
| 2011/0254143 A1 | 10/2011 | Chen | |
| 2012/0126378 A1 | 5/2012 | San Antonio | |
| 2012/0267750 A1 | 10/2012 | Imai et al. | |
| 2012/0273892 A1 | 11/2012 | Uno | |
| 2013/0155745 A1* | 6/2013 | Tanaka | H02M 7/003 363/131 |
| 2014/0131846 A1 | 5/2014 | Shiramizu | |
| 2015/0235932 A1 | 8/2015 | Fernando | |

FOREIGN PATENT DOCUMENTS

| | | |
|---|---|---|
| JP | H 9-102580 | 4/1997 |
| JP | H9-102580 | 4/1997 |
| JP | 2001135765 A | 5/2001 |
| JP | 3384399 | 3/2003 |
| JP | 2004147401 | 5/2004 |
| JP | 2005183463 | 7/2005 |
| JP | 2005183463 A | 7/2005 |
| JP | 2009-27090 | 2/2009 |
| JP | 2011-29262 | 2/2011 |
| JP | 2012129489 | 7/2012 |
| JP | 2012-175070 | 9/2012 |
| TW | 201240046 | 10/2012 |
| WO | WO 98/24128 | 6/1998 |

OTHER PUBLICATIONS

U.S. Appl. No. 61/774,484, filed Mar. 7, 2013, Fernando.
U.S. Appl. No. 61/774,506, filed Mar. 7, 2013, Fernando.
U.S. Appl. No. 61/774,535, filed Mar. 7, 2013, Fernando.
U.S. Appl. No. 61/774,541, filed Mar. 7, 2013, Fernando.
U.S. Appl. No. 61/777,341, filed Mar. 12, 2013, Fernando.
U.S. Appl. No. 61/777,753, filed Mar. 12, 2013, Fernando.
U.S. Appl. No. 61/780,069, filed Mar. 13, 2013, Fernando.
U.S. Appl. No. 61/780,417, filed Mar. 13, 2013, Fernando.
U.S. Appl. No. 61/782,460, filed Mar. 14, 2013, Fernando.
U.S. Appl. No. 13/034,519, filed Feb. 24, 2011, Fernando.
U.S. Appl. No. 13/662,244, filed Oct. 26, 2012, Fernando.
U.S. Appl. No. 14/076,467, filed Nov. 11, 2013, Fernando.
U.S. Appl. No. 14/102,275, filed Dec. 10, 2013, Fernando.
U.S. Appl. No. 14/102,316, filed Dec. 10, 2013, Fernando.
U.S. Appl. No. 14/102,379, filed Dec. 10, 2013, Fernando.
U.S. Appl. No. 14/140,285, filed Dec. 24, 2013, Fernando.
U.S. Appl. No. 14/147,464, filed Jan. 3, 2014, Fernando.
U.S. Appl. No. 14/152,640, filed Jan. 10, 2014, Fernando.
U.S. Appl. No. 14/152,723, filed Jan. 10, 2014, Fernando.
U.S. Appl. No. 14/152,816, filed Jan. 10, 2014, Fernando.

* cited by examiner (Top View)

(Top View)

(Bottom View)

CONTROL AND DRIVER CIRCUITS ON A POWER QUAD FLAT NO-LEAD (PQFN) LEADFRAME

The present application claims the benefit of and priority to provisional application Ser. No. 61/777,753, filed on Mar. 12, 2013, and entitled "Control and Driver Circuits on a Power Quad Flat No-Lead (PQFN) Leadframe." The present application is also a continuation-in-part of application Ser. No. 13/662,244 filed on Oct. 26, 2012, and entitled "Compact Wirebonded Power Quad Flat No-Lead (PQFN) Package," which in turn claims priority to application Ser. No. 13/034,519 filed on Feb. 24, 2011, and entitled "Multi-Chip Module (MCM) Power Quad Flat No-Lead (PQFN) Semiconductor Package Utilizing a Leadframe for Electrical Interconnections," which in turn claims priority to provisional application Ser. No. 61/459,527 filed on Dec. 13, 2010, and entitled "Low Cost Leadframe Based High Power Density Full Bridge Power Device." The present application claims the benefit of and priority to all of the above-identified applications. Moreover, the disclosure and contents of all of the above-identified applications are hereby incorporated fully by reference into the present application.

BACKGROUND

I. Definition

As used herein, the phrase "group III-V" refers to a compound semiconductor including at least one group III element and at least one group V element. By way of example, a group III-V semiconductor may take the form of a III-Nitride semiconductor. "III-Nitride", or "III-N", refers to a compound semiconductor that includes nitrogen and at least one group III element such as aluminum (Al), gallium (Ga), indium (In), and boron (B), and including but not limited to any of its alloys, such as aluminum gallium nitride ($Al Ga_{(1-x)}N$), indium gallium nitride ($In_y Ga_{(1-y)}N$), aluminum indium gallium nitride ($Al_x In_y Ga_{(1-x-y)}N$), gallium arsenide phosphide nitride ($GaAs_a P_b N_{(1-a-b)}$), aluminum indium gallium arsenide phosphide nitride ($Al_x In_y Ga_{(1-x-y)} As_a P_b N_{(1-a-b)}$), for example. III-Nitride also refers generally to any polarity including but not limited to Ga-polar, N-polar, semi-polar, or non-polar crystal orientations. A III-Nitride material may also include either the Wurtzitic, Zincblende, or mixed polytypes, and may include single-crystal, monocrystalline, polycrystalline, or amorphous structures. Gallium nitride or GaN, as used herein, refers to a III-Nitride compound semiconductor wherein the group III element or elements include some or a substantial amount of gallium, but may also include other group III elements in addition to gallium. A group III-V or a GaN transistor may also refer to a composite high voltage enhancement mode transistor that is formed by connecting the group III-V or the GaN transistor in cascode with a lower voltage group IV transistor.

In addition, as used herein, the phrase "group IV" refers to a semiconductor that includes at least one group IV element such as silicon (Si), germanium (Ge), and carbon (C), and may also include compound semiconductors such as silicon germanium (SiGe) and silicon carbide (SiC), for example. Group IV also refers to semiconductor materials which include more than one layer of group IV elements, or doping of group IV elements to produce strained group IV materials, and may also include group IV based composite substrates such as silicon on insulator (SOI), separation by implantation of oxygen (SIMOX) process substrates, and silicon on sapphire (SOS), for example.

II. Background Art

Packages combining several semiconductor devices can simplify circuit design, reduce costs, and provide greater efficiency and improved performance by keeping related and dependent circuit components in close proximity. Furthermore, these packages can facilitate application integration and greater electrical and thermal performance compared to using separate packaging for components.

Quad flat no-lead (QFN) packages are leadless packages for electrical components, such as power semiconductor devices. The QFN packages can utilize a leadframe and wirebonds for connection to the electrical components housed therein. The QFN packages often have limited complexity and electrical routing can be challenging, particularly for more complex configurations. Thus, QFN packages often have simple configurations and house a small number of electrical components.

SUMMARY

Control and driver circuits on a power quad flat no-lead (PQFN) leadframe, substantially as shown in and/or described in connection with at least one of the figures, and as set forth more completely in the claims.

DETAILED DESCRIPTION

Figure 1A:
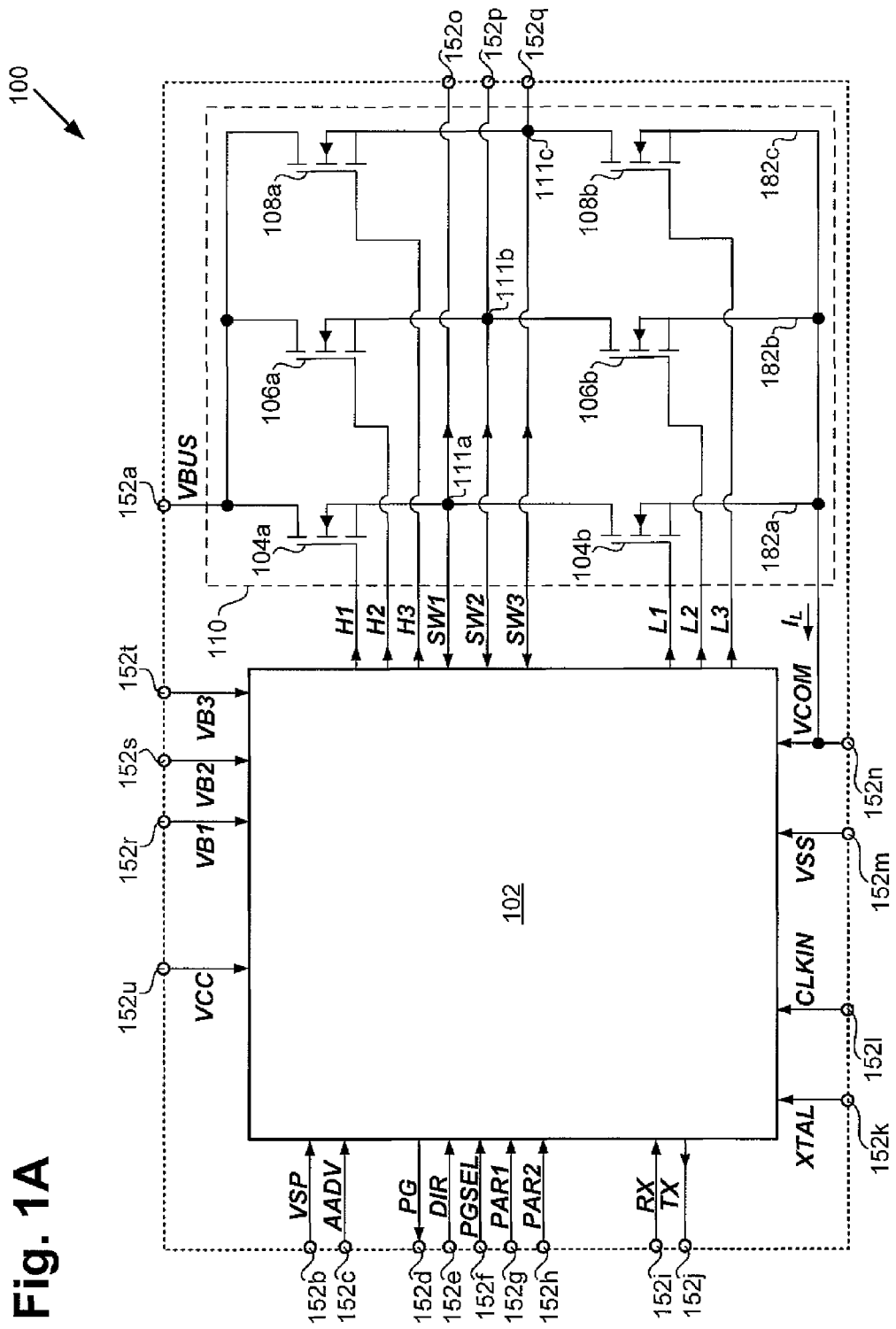
FIG. 1A illustrates a schematic diagram of an exemplary circuit of a power quad flat no-lead (PQFN) package.

The following description contains specific information pertaining to implementations in the present disclosure. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

Figure 1B:
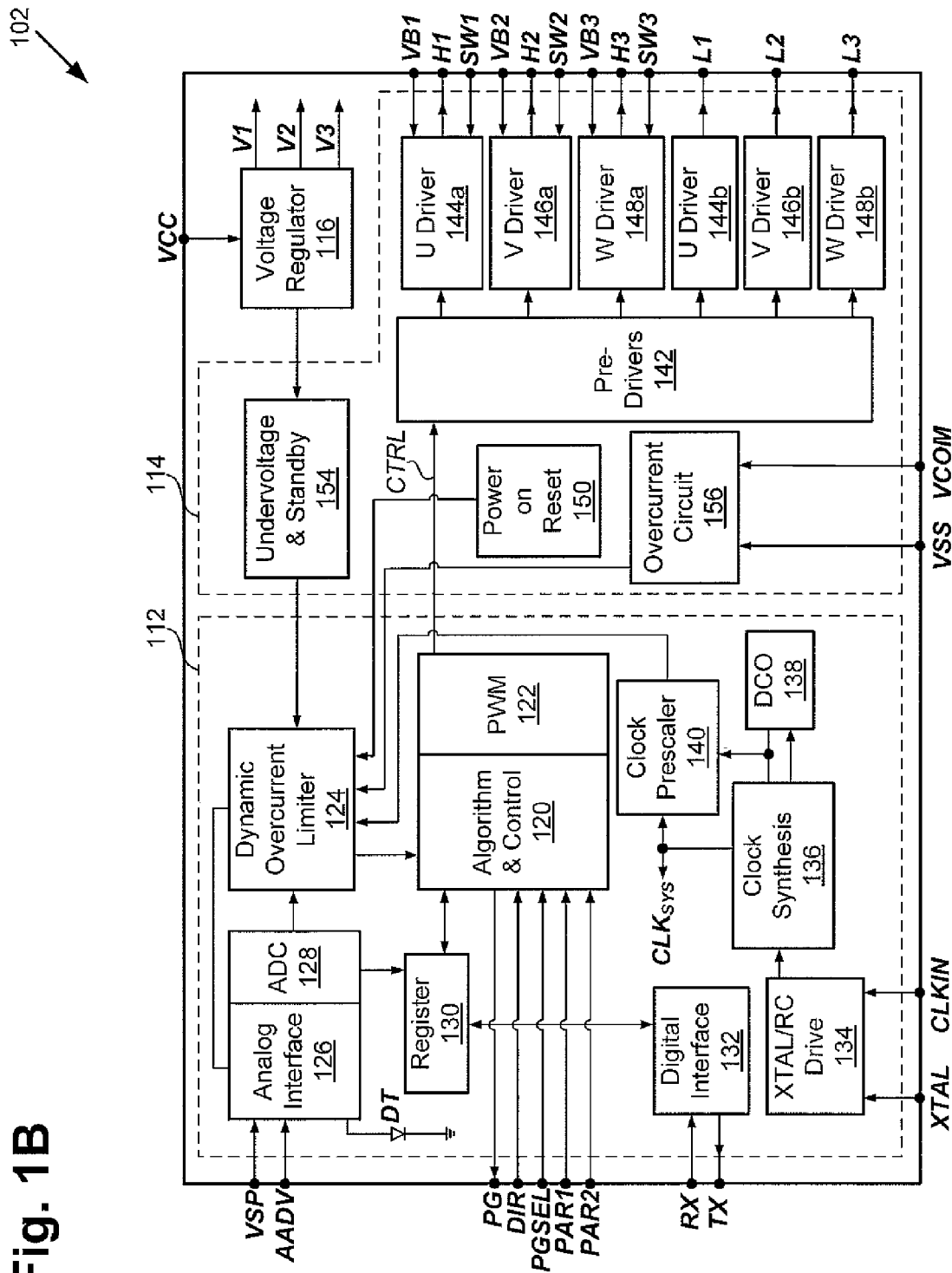
FIG. 1B illustrates a schematic diagram of an exemplary common IC of a PQFN package.

FIG. 1A illustrates a schematic diagram of an exemplary circuit of power quad flat no-lead (PQFN) package 100. FIG. 1B illustrates a schematic diagram of common IC 102 of PQFN package 100.

Referring to FIG. 1A, PQFN package 100 includes common integrated circuit (IC) 102 and multi-phase power inverter 110. Multi-phase power inverter 110 includes U-phase power switches 104a and 104b, V-phase power switches 106a and 106b, and W-phase power switches 108a and 108b.

As shown in FIG. 1B, common IC 102 includes control circuit 112, driver circuit 114, and voltage regulator 116. Control circuit 112 includes algorithm and control circuit 120, pulse width modulation (PWM) circuit 122, dynamic overcurrent limiter 124, analog interface 126, analog-to-digital converter (ADC) 128, register 130, digital interface 132, crystal drive circuit 134, clock synthesis circuit 136, digitally controlled oscillator (DCO) 138, and clock prescaler 140. Driver circuit 114 includes pre-drivers 142, U-phase drivers 144a and 144b, V-phase drivers 146a and 146b, and W-phase drivers 148a and 148b, power on reset circuit 150, overcurrent sensing circuit 156, and undervoltage and standby circuit 154.

FIG. 1A also shows PQFN package 100 as having VBUS terminal 152a, VSP terminal 152b, AADV terminal 152c, PG terminal 152d, DIR terminal 152e, PGSEL terminal 152f, PAR1 terminal 152g, PAR2 terminal 152h, RX terminal 152i, TX terminal 152j, XTAL terminal 152k, CLKIN terminal 152l, VSS terminal 152m, VCOM terminal 152n, SW1 terminal 152o, SW2 terminal 152p, SW3 terminal 152q, VB1 terminal 152r, VB2 terminal 152s, VB3 terminal 152t, and VCC terminal 152u, which are collectively referred to as I/O terminals 152.

Figure 1C:
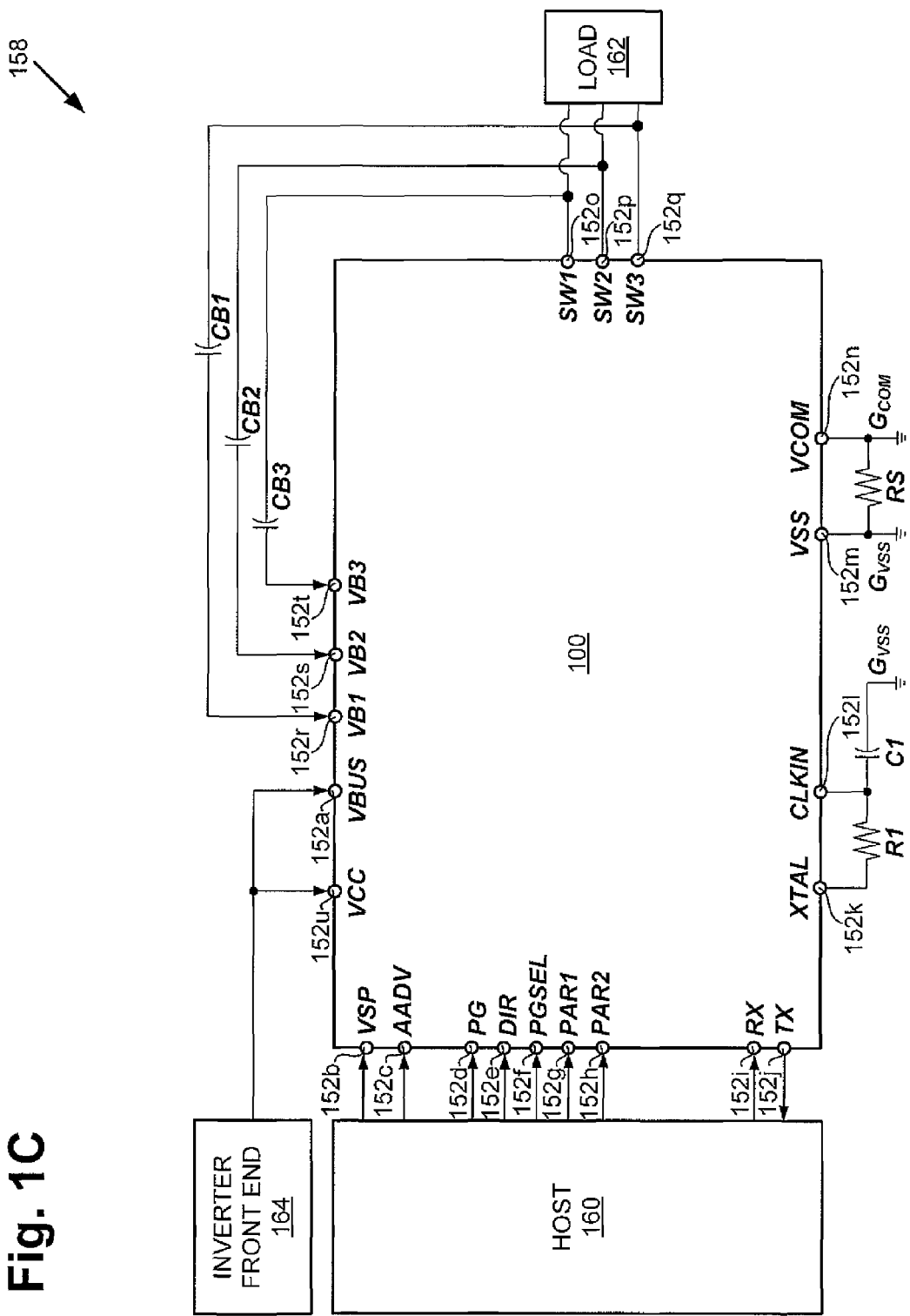
FIG. 1C illustrates a schematic diagram of a PQFN package in an exemplary multi-phase power inverter circuit.

FIG. 1C illustrates a schematic diagram of PQFN package 100 in multi-phase power inverter circuit 158. More particularly, FIG. 1C shows an exemplary manner in which I/O terminals 152 of PQFN package 100 can be connected in multi-phase power inverter circuit 158. FIG. 1C shows host 160, load 162, inverter front end 164, shunt RS, resistor R1, capacitor C1, and bootstrap capacitors CB1, CB2, and CB3 coupled to PQFN package 100.

In PQFN package 100, driver circuit 114 of FIG. 1B is configured to drive multi-phase power inverter 110 responsive to a control signal (e.g. control signals CTRL) from control circuit 112. Control circuit 112 is configured to generate the control signal (e.g. control signals CTRL) and to provide the control signal to driver circuit 114. By including driver circuit 114 and control circuit 112 in PQFN package 100, PQFN package 100 can simplify circuit design, reduce costs, and provide greater efficiency and improved performance, amongst other advantages. Including control circuit 112 and driver circuit 114 on common IC 102, as shown in FIG. 1B, may enhance these advantages.

Thus, common IC 102 is configured to generate control signals CTRL and to drive multi-phase power inverter 110 responsive to control signals CTRL. In multi-phase power inverter 110, U-phase power switches 104a and 104b, V-phase power switches 106a and 106b, and W-phase power switches 108a and 108b are vertical conduction power devices, for example, group IV semiconductor power metal-oxide-semiconductor field effect transistors (power MOSFETs) such as fast-reverse epitaxial diode field effect transistors (FREDFETs), or group IV semiconductor insulated-gate bipolar transistors (IGBTs). In other implementations group III-V semiconductor FETs, HEMTs (high electron mobility transistors) and, in particular, GaN FETs and/or HEMTs can be used as power devices in U-phase power switches 104a and 104b, V-phase power switches 106a and 106b, and W-phase power switches 108a and 108b. As defined above, Gallium nitride or GaN, as used herein, refers to a III-Nitride compound semiconductor wherein the group III element or elements include some or a substantial amount of gallium, but may also include other group III elements in addition to gallium. As previously stated, a group III-V or a GaN transistor may also refer to a composite high voltage enhancement mode transistor that is formed by connecting the group III-V or the GaN transistor in cascode with a lower voltage group IV transistor. PQFN package 100 provides a full bridge power device, however, alternative implementations can provide other package configurations as required by the particular application. Also, while multi-phase power inverter 110 is a three phase power inverter, in some implementations, multi-phase power inverter 110 may be a two phase power inverter.

As described above, driver circuit 114 is configured to drive multi-phase power inverter 110 responsive to control signals CTRL from control circuit 112. Control circuit 112 is a three phase control circuit and thus, control signals CTRL include control signals for U-phase power switch 104a, V-phase power switch 106a, and W-phase power switch 108a, which are high side power switches. Pre-drivers 142, which can include a high-voltage level shifter, receive control signals CTRL. The high-voltage level shifter can have termination that can sustain, for example, approximately 600 volts.

Level shifted versions of control signals CTRL are received by U-phase driver 144a, V-phase driver 146a, and W-phase driver 148a. U-phase driver 144a, V-phase driver 146a, and W-phase driver 148a further receive SW1, SW2, and SW3 from U-phase output 111a, V-phase output 111b, and W-phase output 111c (shown in FIG. 1A) respectively. U-phase driver 144a, V-phase driver 146a, and W-phase driver 148a generate high side gate signals H1, H2, and H3 from control signals CTRL and provide high side gate signals H1, H2, and H3 to U-phase power switch 104a, V-phase power switch 106a, and W-phase power switch 108a, as shown in FIG. 1A. Thus, U-phase driver 144a, V-phase driver 146a, and W-phase driver 148a are high side drivers and are coupled to high side power switches of multi-phase power inverter 110.

Similarly, control signals CTRL include control signals for U-phase power switch 104b, V-phase power switch 106b, and W-phase power switch 108b, which are low side power switches. Pre-drivers 142, which can include a low-voltage level shifter, receive control signals CTRL. The low-voltage level shifter can compensate for differences between logic ground $G_{VSS}$ and power stage ground $G_{COM}$. However, the low-voltage level shifter may not be utilized in some implementations. For example, the low-voltage level shifter may not be utilized where logic ground $G_{VSS}$ and power stage ground $G_{COM}$ are part of a common ground.

In the present implementation, level shifted versions of control signals CTRL are received by U-phase driver 144b, V-phase driver 146b, and W-phase driver 148b. U-phase driver 144b, V-phase driver 146b, and W-phase driver 148b generate low side gate signals L1, L2, and L3 from control signals CTRL and provide low side gate signals L1, L2, and L3 to U-phase power switch 104b, V-phase power switch 106b, and W-phase power switch 108b, as shown in FIG. 1A. Thus, U-phase driver 144b, V-phase driver 146b, and W-phase driver 148b are low side drivers and are coupled to low side power switches of multi-phase power inverter 110.

In the present implementation, U-phase drivers 144a and 144b, V-phase drivers 146a and 146b, and W-phase drivers 148a and 148b are impedance matched to respective ones of U-phase power switches 104a and 104b, V-phase power switches 106a and 106b, and W-phase power switches 108a and 108b. U-phase drivers 144a and 144b, V-phase drivers 146a and 146b, and W-phase drivers 148a and 148b can thereby drive U-phase power switches 104a and 104b, V-phase power switches 106a and 106b, and W-phase power switches 108a and 108b without gate resistors which allows PQFN package 100 to be smaller and less complex.

Common IC 102, and more particularly, driver circuit 114 can thereby drive switching of U-phase power switches 104a and 104b, V-phase power switches 106a and 106b, and W-phase power switches 108a and 108b using U-phase drivers 144a and 144b, V-phase drivers 146a and 146b, and W-phase drivers 148a and 148b to, for example, power load 162 (which is a motor, as one example).

As shown in FIG. 1C, load 162 is coupled to PQFN package 100 and is configured to receive U-phase output 111a, V-phase output 111b, and W-phase output 111c respectively from SW1 terminal 252o, SW2 terminal 252p, and SW3 terminal 252q. In doing so, load 162 generates load current $I_L$, which is shown in FIG. 1A.

Referring to FIG. 1C, inverter front end 164 is configured to provide bus voltage VBUS to VBUS terminal 152a of PQFN package 100 and supply voltage VCC to VCC terminal 152u of PQFN package 100. In the present implementation, inverter front end 164 is an AC/DC front end and can include an input filter (e.g. an EMI filter) coupled to an AC to DC rectifier. The AC voltage can be, as one example, an outlet voltage, such as 230 volts. The DC voltage can be, for example, approximately 300 volts to approximately 400 volts for bus voltage VBUS and supply voltage VCC.

As can be seen in FIG. 1A, VBUS terminal 152a of PQFN package 100 receives bus voltage VBUS, which is coupled to respective drains (and/or collectors in some implementations) of U-phase power switch 104a, V-phase power switch 106a, and W-phase power switch 108a. Bus voltage VBUS is thereby configured to power multi-phase power inverter 110.

Also in FIG. 1A, VCC terminal 152u of PQFN package 100 is configured to receive supply voltage VCC, which is coupled to common IC 102. Supply voltage VCC is configured to power common IC 102. As shown in FIG. 1B, PQFN package 100 may include voltage regulator 116, which is configured to receive supply voltage VCC. Voltage regulator 116 is for control circuit 112 and driver circuit 114 of PQFN package 100. Thus, in some implementation, VCC terminal 152u can be a common supply voltage terminal for control circuit 112 and driver circuit 114. As shown, common IC 102 includes voltage regulator 116, which is configured to power control circuit 112 and driver circuit 114 of common IC 102. Voltage regulator 116 is configured to generate driver voltage V1, digital circuitry voltage V2, and analog circuitry voltage V3 from supply voltage VCC.

In the present implementation, diver voltage V1 is configured to power drivers of driver circuit 114, such as U-phase drivers 144a and 144b, V-phase drivers 146a and 146b, and W-phase drivers 148a and 148b. Driver voltage V1 can be, for example, approximately 15 volts. U-phase, V-phase, and W-phase drivers 144b, 146b, and 148b are coupled to driver voltage V1 whereas U-phase, V-phase, and W-phase drivers 144a, 146a, and 148a are coupled to respective bootstrap supply voltages VB1, VB2, and VB3.

VB1 terminal 152r, VB2 terminal 152s, and VB3 terminal 152t of PQFN package 100 (shown in FIG. 1C) are configured to receive respective bootstrap supply voltages VB1, VB2, and VB3, which are coupled to common IC 102. Bootstrap supply voltages VB1, VB2, and VB3 are generated using bootstrap capacitors CB1, CB2, and CB3, bootstrap diodes in U-phase, V-phase, and W-phase drivers 144a, 146a, and 148a, and driver voltage V1. As shown in FIG. 1C, bootstrap capacitors CB1, CB2, and CB3 are respectively coupled to SW1 terminal 152o, SW2 terminal 152p, and SW3 terminal 152q and VB1 terminal 152r, VB2 terminal 152s, and VB3 terminal 152t. Voltage regulator 116, and more particularly driver voltage V1 is configured to charge bootstrap supply voltages VB1, VB2, and VB3 through the bootstrap diodes in U-phase driver 144a, V-phase driver 146a, and W-phase driver 148a.

Also in the present implementation digital circuitry voltage V2 is configured to power digital circuitry of common IC 102, which includes as examples, algorithm and control circuit 120, PWM circuit 122, dynamic overcurrent limiter 124, ADC 128, register 130, digital interface 132, and clock prescaler 140. Digital circuitry voltage V2 can be, for example, approximately 3.3 volts. 13y including digital circuitry that is configured to generate control signals CTRL, control circuit 112 offers robust control functionality.

Analog circuitry voltage V3 is configured to power analog circuitry of common IC 102, which includes as examples, pre-drivers 142, power on reset circuit 150, overcurrent sensing circuit 156, undervoltage and standby circuit 154, analog interface 126, crystal drive circuit 134, clock synthesis circuit 136, DCO 138, and clock prescaler 140. Analog circuitry voltage V3 can be, for example, approximately 3.3 volts.

Thus, common IC 102 includes voltage regulator 116, which is configured to power control circuit 112 and driver circuit 114 of common IC 102. Typical multi-phase power inverter circuits include voltage regulators as discrete components. However, by including voltage regulator 116 in PQFN package 100, either internal or external to common IC 102, PQFN package 100 can offer simplified circuit design, reduced cost, greater efficiency and improved performance, amongst other advantages.

In FIG. 1C, VSS terminal 152m of PQFN package 100 is coupled to logic ground $G_{VSS}$ to receive logic ground VSS and VCOM terminal 152n of PQFN package 100 is coupled to power stage ground $G_{COM}$ to receive power stage ground VCOM. FIGS. 1A and 1B further show that common IC 102 is configured to receive logic ground VSS and common IC 102 and multi-phase power inverter 110 are configured to receive power stage ground VCOM.

Logic ground VSS is a ground of a support logic circuit of common IC 102. The support logic circuit includes pre-drivers 142, undervoltage and standby circuit 154, power on reset circuit 150, overcurrent sensing circuit 156, and control circuit 112.

Power stage ground VCOM is a ground of U-phase power switches 104a and 104b, V-phase power switches 106a and 106b, and W-phase power switches 108a (i.e. of multi-phase power inverter 110). FIG. 1A shows power stage ground VCOM coupled to sources (and/or emitter is some implementations) of U-phase power switches 104a and 104b, V-phase power switches 106a and 106b, and W-phase power switches 108a and 108b within PQFN package 100. Power stage ground VCOM can also be for common IC 102. For example, power stage ground VCOM is also coupled to U-phase, V-phase, and W-phase drivers 144b, 146b, and 148b of driver circuit 114 in the present implementation.

As shown in FIG. 1C, logic ground VSS being separate from power stage ground VCOM is provided for in multi-phase power inverter circuit 158 using shunt RS. Shunt RS is coupled across VSS terminal 152m and VCOM terminal 152n of PQFN package 100. Thus, load current $I_L$ shown in FIG. 1A, from for example, load 162, is combined phase current from U-phase leg 182a, V-phase 182b, and W-phase leg 182c of multi-phase power inverter 110. U-phase leg 182a, V-phase 182b, and W-phase leg 182c correspond to a source/emitter of U-phase power switch 104b, V-phase power switch 106b, and W-phase power switch 108b respectively. Thus, in some implementations, control circuit 112 is configured to receive a combined phase current from a source/emitter of each of U-phase power switch 104b, V-phase power switch 106b, and W-phase power switch 108b (i.e. low side power switches). In closed loop implementations of multi-phase power inverter circuit 158, such as in the present implementation, control circuit 112 utilizes load current $I_L$ to generate control signals CTRL. In open loop implementations, control circuit 112 may not utilize load current $I_L$ to generate control signal CTRL.

Thus, in the present implementation, PQFN package 100 has logic ground VSS separate from power stage ground VCOM. During switching of U-phase power switches 104a and 104b, V-phase power switches 106a and 106b, and W-phase power switches 108a and 108b, a voltage can develop across shunt RS. By having logic ground VSS separate from power stage ground VCOM, supply voltage VCC for the support logic circuit can be made with respect to the logic ground instead of the voltage across shunt RS. Thus, by using separate grounds, PQFN package 100 is protected from latch up and noise malfunction, which otherwise can be caused by excess switching voltages from U-phase power switches 104a and 104b, V-phase power switches 106a and 106b, and W-phase power switches 108a and 108b.

In other implementations, logic ground VSS is not separate from power stage ground VCOM and PQFN package 100 instead has a single ground. For example, VSS terminal 152m and VCOM terminal 152n can be combined into a single terminal or can be are shorted to one another. In one such implementation, PQFN package 100 is an open source/emitter PQFN package, in which load current from at least two of U-phase leg 182a, V-phase leg 182b, and W-phase leg 182c of multi-phase power inverter 110 are provided separately as opposed to load current $I_L$. Thus, for example, common IC 102 utilizes those respective load currents to generate control signals CTRL.

As described above, control circuit 112 can utilize load current $I_L$ to generate control signals CTRL. For example, control circuit 112 is configured to receive load current $I_L$ from overcurrent sensing circuit 156. Dynamic overcurrent limiter 124 is configured to receive load current $I_L$ from overcurrent sensing circuit 156 and is configured to provide load current $I_L$ to algorithm and control circuit 120.

In control circuit 112, algorithm and control circuit 120 is configured to control switching of multi-phase power inverter 110. In the present implementation, algorithm and control circuit 120 utilizes field-oriented control (FOC) based on load current $I_L$. Algorithm and control circuit 120 of control circuit 112 is configured to reconstruct at least two phase currents of multi-phase power inverter 110 from load current $I_L$, which is a combined phase current. The at least two phase currents that are reconstructed can correspond to phase current in any of U-phase leg 182a, V-phase 182b, and W-phase leg 182c. The FOC can be based on direct axis (d axis) and quadrature axis (q axis) coordinates of the phase current.

Algorithm and control circuit 120 is coupled to PWM circuit 122 and utilizes PWM circuit 122 to generate control signals CTRL, which are pulse width modulated control signals. In the present implementation, PWM circuit 122 is a space vector modulation circuit that is configured to generate control signals CTRL (by utilizing space vector modulation) as space vector modulated control signals. PWM circuit 122 is configured to generate control signals CTRL from volt second commands from algorithm and control circuit 120. PWM circuit 122 can perform two and/or three phase PWM. PWM circuit 122 may perform two phase PWM with approximately 20% lower loss than three phase PWM.

Thus, common IC 102 is configured to generate control signals CTRL and to drive multi-phase power inverter 110 responsive to control signals CTRL. More particularly, control circuit 112 is configured to generate control signals CTRL and driver circuit 114 is configured to drive multi-phase power inverter 110 responsive to control signals CTRL.

Control circuit 112 and driver circuit 114 can include additional circuitry to provide enhanced functionality to PQFN package 100. As show in FIG. 1B, driver circuit 114 includes undervoltage and standby circuit 154. Undervoltage and standby circuit 154 is coupled to voltage regulator 116 and can detect an undervoltage condition when supply voltage VCC falls below a threshold voltage. Undervoltage and standby circuit 154 is configured to notify dynamic overcurrent limiter 124 of the undervoltage condition and in response, dynamic overcurrent limiter 124 is configured to notify algorithm and control circuit 120 to disable switching of multi-phase power inverter 110.

Timing of the digital circuitry in common IC 102 is configured to be controlled by utilizing system clock $CLK_{SYS}$ and clock prescaler 140. System clock $CLK_{SYS}$ can have a frequency of, for example, approximately 10 MHz. In the present implementation, system clock $CLK_{SYS}$ is generated utilizing crystal drive circuit 134, clock synthesis circuit 136, and DCO 138. As shown in FIG. 1C, resistor R1 is coupled across XTAL terminal 152k and CLKIN terminal 152l and capacitor C1 is coupled to CLKIN terminal 152l and logic ground $G_{VSS}$ so as to set timing of system clock $CLK_{SYS}$. Crystal drive circuit 134 is configured to receive XTAL signal and CLKIN signal from XTAL terminal 152k and CLKIN terminal 152l.

PQFN package 100 is configured to disable switching of multi-phase power inverter 110 responsive to power on reset circuit 150. Power on reset circuit 150 is configured to force reset of the digital circuitry in control circuit 112 during power on until various circuitry in common IC 102 is prepared for stable operation. For example, power on reset circuit 150 can provide a reset signal to dynamic overcurrent limiter 124 and dynamic overcurrent limiter 124 can notify algorithm and control circuit 120 to disable switching of multi-phase power inverter 110.

Dynamic overcurrent limiter 124 is coupled to overcurrent sensing circuit 156 and is configured to provide overcurrent protection to multi-phase power inverter 110 utilizing overcurrent information (e.g. a voltage) received from overcurrent sensing circuit 156. For example, if the overcurrent information exceeds a threshold value dynamic overcurrent limiter 124 can notify algorithm and control circuit 120 to disable switching of multi-phase power inverter 110. When the overcurrent information no longer exceeds the threshold value, switching of multi-phase power inverter 110 can resume.

Dynamic overcurrent limiter 124 is also coupled to analog interface 126 and ADC 128 and is configured to provide over-temperature protection to multi-phase power inverter 110. Thus, dynamic overcurrent limiter 124 can also be referred to as over-temperature protection circuit 124. Dynamic overcurrent limiter 124 is configured to receive temperature information from thermistor DT. Thermistor DT is a negative temperature coefficient diode type thermistor, as one example. Dynamic overcurrent limiter 124 is configured to notify algorithm and control circuit 120 if the temperature information from thermistor DT exceeds a reference value so as to disable or otherwise alter switching of multi-phase power inverter 110.

Typical multi-phase power inverter circuits utilize a discrete temperature sensor to measure temperature of power switches of a multi-phase power inverter. The discrete temperature sensor is mounted on a printed circuit board (PCB) external to packaging. However, this configuration requires a large distance between the discrete temperature sensor and the power switches. As such, temperature sensing using the discrete temperature sensor is inaccurate and slow, which can result in the power switches being exposed to high temperatures.

In accordance with some implementations of the present disclosure, such as that shown in FIG. 1B, PQFN package 100, and more particularly common IC 102 includes thermistor DT. As such, thermistor DT can be close to multi-phase power inverter 110. For example, in the present implementation, thermistor DT is approximately 2 to approximately 3 millimeters from U-phase power switches 104a and 104b, V-phase power switches 106a and 106b, and W-phase power switches 108a and 108b. Temperature sensing using thermistor DT can therefore be highly accurate and fast, which enables precise over-temperature protection by dynamic overcurrent limiter 124.

Furthermore, PQFN package 100 achieves a footprint of approximately 12 mm by approximately 12 mm. In other implementations, PQFN package 100 can have a footprint of greater than 12 mm by 12 mm. In still other implementations, PQFN package 100 can have a footprint of less than 12 mm by 12 mm. As PQFN package 100 is highly compact and thermally consistent, thermistor DT can be in common IC 102 while still providing accurate temperature measurements of multi-phase power inverter 110. This can further increase the accuracy and speed of the temperature sensing. Also, including thermistor DT in common IC 102 simplifies circuit design, reduces costs, and allows for PQFN package 100 to be made smaller.

Typical multi-phase power inverter circuits require a single threshold value for over-temperature protection due to slow and inaccurate temperature sensing. However, in some implementations, dynamic overcurrent limiter 124 is configured to provide over-temperature protection to multi-phase power inverter 110 utilizing multiple threshold values (e.g. at least two). Analog interface 126 can provide temperature information from thermistor DT to ADC 128. ADC 128 can generate digitized temperature information from the temperature information and can provide the digitized temperature information to dynamic overcurrent limiter 124. Dynamic overcurrent limiter 124 is configured to compare the digitized temperature information to any of the multiple threshold values. It is noted that in some implementations the temperature information can remain analog.

In the implementation shown, dynamic overcurrent limiter 124 is configured to provide over-temperature protection to multi-phase power inverter 110 utilizing three threshold values (e.g. temperature values). The three threshold values define different over-temperature protection modes.

At a first threshold value, for example from approximately 100 degrees Celsius to approximately 120 degrees Celsius, algorithm and control circuit 120 is configured to disable switching of U-phase power switch 104a, V-phase power switch 106a, and W-phase power switch 108a (e.g. to disable high side switching). The switching is disabled responsive to a notification from dynamic overcurrent limiter 124. However, switching of U-phase power switch 104b, V-phase power switch 106b, and W-phase power switch 108b is maintained. Thus, load current $I_L$ can correspond to residue current from load 162 through U-phase power switch 104b, V-phase power switch 106b, and W-phase power switch 108b.

At a second threshold value, for example from approximately 120 degrees Celsius to approximately 140 degrees Celsius, algorithm and control circuit 120 is configured to periodically disable switching of multi-phase power inverter 110 for at least one PWM cycle, which may utilize zero vectors. For example, for a 10 KHz carrier frequency, switching can be periodically disabled for a 100 ms period. The periodic disabling is responsive to a notification from dynamic overcurrent limiter 124.

At a third threshold value, for example at approximately 140 degrees Celsius or greater, algorithm and control circuit 120 is configured to completely disable switching of multi-phase power inverter 110. The complete disabling is responsive to a notification from dynamic overcurrent limiter 124.

Thus, the multiple threshold values define multiples modes of over-temperature protection for multi-phase power inverter 110. The multiple modes of over-temperature protection increasingly limit current in multi-phase power inverter 110 as the multiple threshold values (e.g. temperature values) increase. Dynamic overcurrent limiter 124 is thereby configured to increasingly limit current in multi-phase power inverter 110 as the temperature of multi-phase power inverter 110 increases.

Now Referring to FIG. 1B with FIG. 1C, host 160 is configured to provide VSP to VSP terminal 152b. Common IC 102 (control circuit 112) is configured to receive VSP from VSP terminal 152b. Control circuit 112 is configured to utilize VSP to set the speed of load 162, which can be a motor. For example, VSP is an analog voltage command and can be from an analog potential meter, as one example.

Host 160 is further configured to provide AADV to AADV terminal 152c. Common IC 102 (control circuit 112) is configured to receive AADV from AADV terminal 152c. Control circuit 112 is configured to utilize AADV to change an angle relationship between load 162 and the phase current versus voltage command. This can increase the efficiency of load 162.

Host 160 is also configured to receive PG from PG terminal 152d and to provide PGSEL to PGSEL terminal 152f. Common IC 102 (control circuit 112) is configured to provide PG to PG terminal 152d and to receive PGSEL from PGSEL terminal 152f. PG can include pulses that are proportional to the speed of load 162 so as to indicate the speed of load 162 to host 160 and/or another circuit. Common IC 102 (control circuit 112) is configured to select how many pulses are in PG per revolution. For example, common IC 102 can utilize PGSEL to select between eight and twelve pulses per revolution.

Host 160 is additionally configured to provide DIR to DIR terminal 152e. Common IC 102 (e.g. control circuit 112) is configured to receive DIR from DIR terminal 152e. Control circuit 112 is configured to utilize DIR to select a direction for load 162 (e.g. a motor).

Host 160 is further configured to provide PAR1 to PAR1 terminal 152g and PAR2 to PAR2 terminal 152h. Common IC 102 (e.g. control circuit 112) is configured to receive PAR1 from PAR1 terminal 152g and PAR2 from PAR2 terminal 152h. Control circuit 112 is configured to utilize PAR1 and PAR2 to adjust algorithm and control circuit 120 so as to accommodate different types of loads for load 162 (e.g. different types of motors). This can account for loads having differing Ke, Kt, poll numbers, and/or other characteristics.

Host 160 is also configured to receive TX from TX terminal 152*j* and to provide RX to RX terminal 152*i*. Common IC 102 (e.g. control circuit 112) is configured to provide TX to TX terminal 152*j* and to receive RX from RX terminal 152*i*. Utilizing RX, TX, digital interface 132, and register 130, control circuit 112 can digitally communicate with, for example, host 160. In the present implementation, digital interface 132 includes a universal asynchronous receiver/transmitter (UART).

It will be appreciated that in various implementations, the number, quantity, and location of I/O terminals 152 are different than what is shown. For example, in various implementations, a common IC that is different than common IC 102 can be utilized, which can have different capabilities and/or I/O requirements than common IC 102. This may be reflected in I/O terminals 152 as well as other connections of PQFN package 100. For example, while the present implementation shows a single shunt implementation, as discussed above, in other implementations PQFN package 100 is an open source/emitter package. Furthermore, control circuit 112 and driver circuit 114 may be on separate ICs in some implementations, which can impact I/O terminals 152. As another example, in some implementations, XTAL and CLKIN are generated within PQFN package 100 (and/or control circuit 112) and PQFN package 100 does not include XTAL terminal 152*k* and CLKIN terminal 152*l*.

Thus, PQFN package 100 includes multi-phase power inverter 110, control circuit 112, and driver circuit 114, which are each situated on a PQFN leadframe of PQFN package 100. By including driver circuit 114 and control circuit 112 in PQFN package 100, PQFN package 100 can simplify circuit design, reduce costs, and provide greater efficiency and improved performance, amongst other advantages. Furthermore, including control circuit 112 and driver circuit 114 on common IC 102, as shown in FIG. 1B, may enhance these advantages.

Figure 2A:
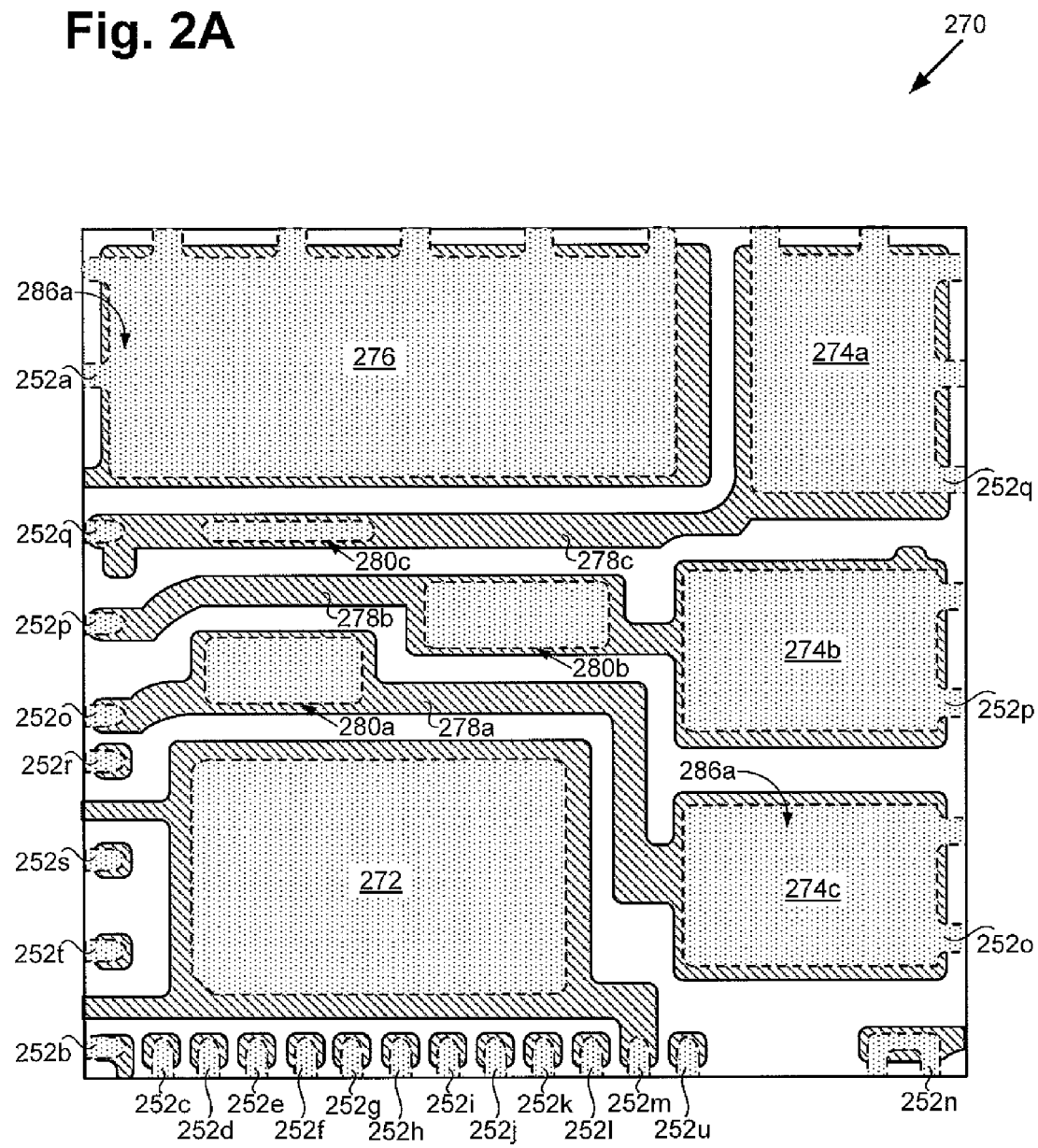
FIG. 2A illustrates a top-plan view of a PQFN leadframe of an exemplary PQFN package.
Figure 2B:
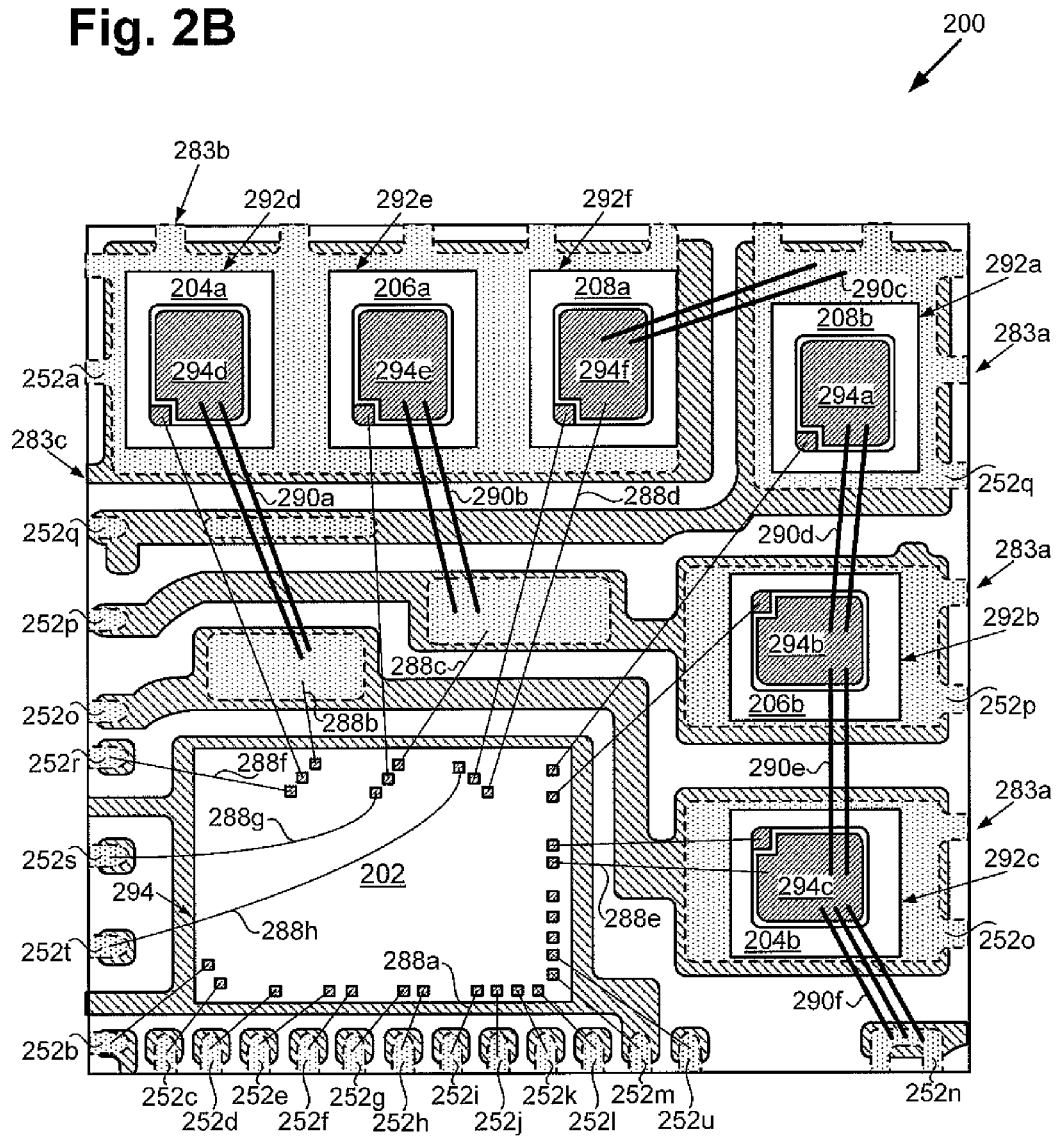
FIG. 2B illustrates a top-plan view of an exemplary PQFN package with wirebonds.
Figure 2C:
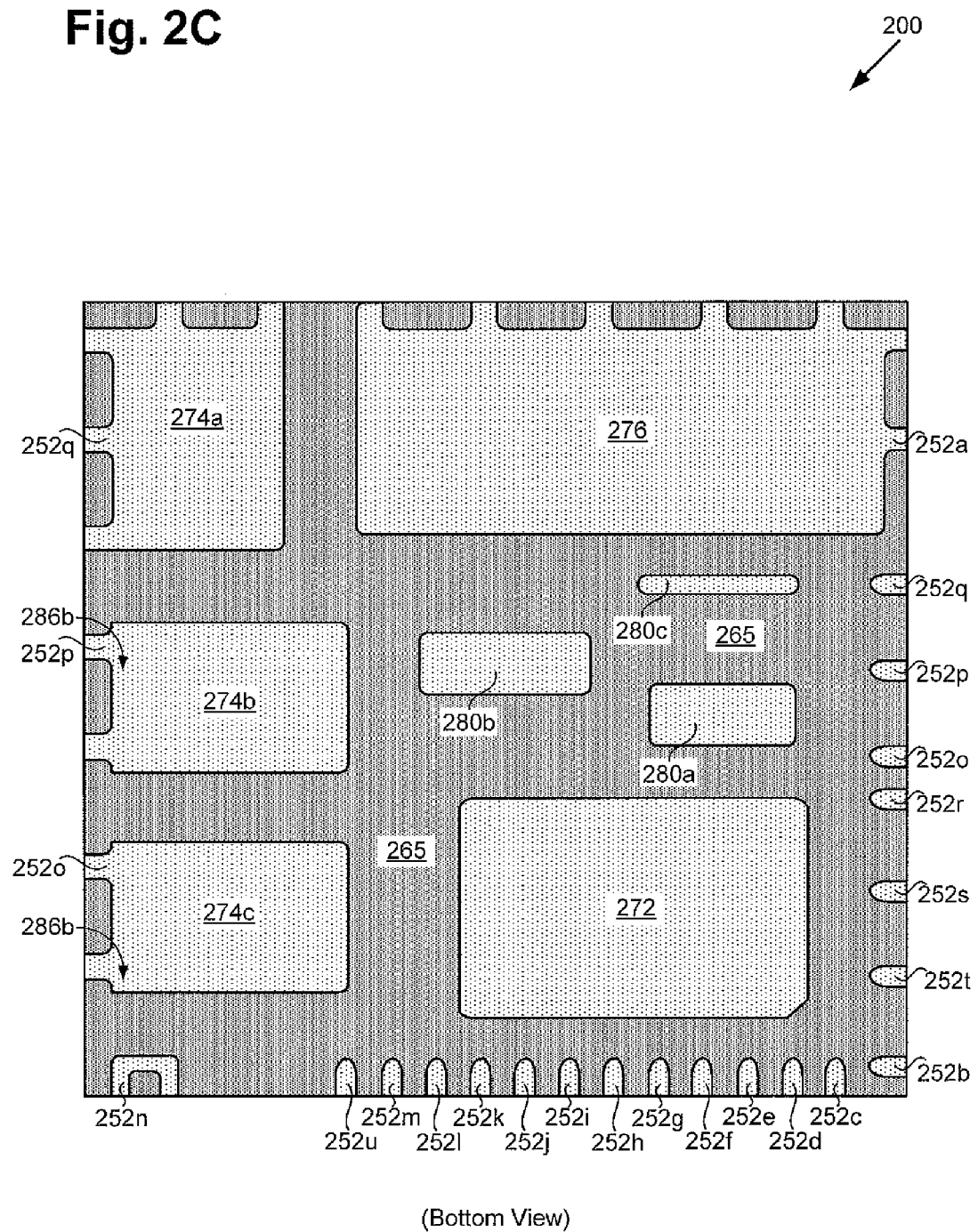
FIG. 2C illustrates a bottom-plan view of an exemplary PQFN package.

Turning to FIGS. 2A, 2B, and 2C, FIG. 2A illustrates a top-plan view of PQFN leadframe 270 of PQFN package 200 of FIGS. 2B and 2C. FIG. 2B illustrates a top-plan view of PQFN package 200. FIG. 2C illustrates a bottom-plan view of PQFN package 200. In the present implementation, PQFN package 200 is a multi-chip module (MCM) PQFN package, which can have a footprint of approximately 12 mm by approximately 12 mm. In other implementations, PQFN package 200 can have a footprint of greater than 12 mm by 12 mm. In still other implementations, PQFN package 200 can have a footprint of less than 12 mm by 12 mm.

PQFN package 200 corresponds to PQFN package 100 in FIGS. 1A, 1B, and 1C. For example, PQFN package 200 includes common IC 202, U-phase power switches 204*a* and 204*b*, V-phase power switches 206*a* and 206*b*, and W-phase power switches 208*a* and 208*b* corresponding respectively to common IC 102, U-phase power switches 104*a* and 104*b*, V-phase power switches 106*a* and 106*b*, and W-phase power switches 108*a* and 108*b* in FIG. 1A.

Furthermore, PQFN package 200 includes VBUS terminal 252*a*, VSP terminal 252*b*, AADV terminal 252*c*, PG terminal 252*d*, DIR terminal 252*e*, PGSEL terminal 252*f*, PAR1 terminal 252*g*, PAR2 terminal 252*h*, RX terminal 252*i*, TX terminal 252*j*, XTAL terminal, 252*k*, CLK terminal 252*l*, VSS terminal 252*m*, VCOM terminal 252*n*, SW1 terminals 252*o*, SW2 terminals 252*p*, SW3 terminals 252*q*, VB1 terminal 252*r*, VB2 terminal 252*s*, VB3 terminal 252*t*, and VCC terminal 252*u* (also referred to as "I/O terminals 252") corresponding respectively to VBUS terminal 152*a*, VSP terminal 152*b*, AADV terminal 152*c*, PG terminal 152*d*, DIR terminal 152*e*, PGSEL terminal 152*f*, PAR1 terminal 152*g*, PAR2 terminal 152*h*, RX terminal 152*i*, TX terminal 152*j*, XTAL terminal 152*k*, CLKIN terminal 152*l*, VSS terminal 152*m*, VCOM terminal 152*n*, SW1 terminal 152*o*, SW2 terminal 152*p*, SW3 terminal 152*q*, VB1 terminal 152*r*, VB2 terminal 152*s*, VB3 terminal 152*t*, and VCC terminal 152*u* of PQFN package 100.

FIG. 2A shows PQFN leadframe 270 including common IC die pad 272, W-phase output pad 274*a*, V-phase output pad 274*b*, U-phase output pad 274*c*, and common drain/collector pad 276. PQFN leadframe 270 further includes U-phase, V-phase, and W-phase output strips 278*a*, 278*b*, and 278*c*. Leadframe island 280*a* is situated on U-phase output strip 278*a* of PQFN leadframe 270, leadframe island 280*b* is situated on V-phase output strip 278*b* of PQFN leadframe 270, and leadframe island 280*c* is situated on W-phase output strip 278*c* of PQFN leadframe 270.

U-phase output strip 278*a* is electrically and mechanically connected (e.g. integrally connected) to U-phase output pad 274*c* of PQFN leadframe 270 and to SW1 terminals 252*o*. V-phase output strip 278*b* is electrically and mechanically connected (e.g. integrally connected) to V-phase output pad 274*b* of PQFN leadframe 270 and to SW2 terminals 252*p*. Also, W-phase output strip 278*c* is electrically and mechanically connected (e.g. integrally connected) to W-phase output pad 274*a* of PQFN leadframe 270 and to SW3 terminals 252*q*.

As shown in FIG. 2B, U-phase output strip 278*a*, V-phase output strip 278*b*, and W-phase output strip 278*c* can optionally substantially traverse across PQFN leadframe 270. For example, U-phase output strip 278*a*, V-phase output strip 278*b*, and W-phase output strip 278*c* extend respectively from U-phase output pad 274*c*, V-phase output pad 274*b*, and W-phase output pad 274*a* to edge 283*c* of PQFN package 200. In doing so, any of U-phase output strip 278*a*, V-phase output strip 278*b*, and W-phase output strip 278*c* can provide, for example, additional I/O terminals 252 for PQFN package 200. For example, U-phase output strip 278*a* is shown as providing an additional SW1 terminal 252*o* at edge 283*c* of PQFN package 200.

PQFN leadframe 270 can comprise a material with high thermal and electrical conductivity such as copper (Cu) alloy C194 available from Olin Brass®. Top-side 286*a* of PQFN leadframe 270 can be selectively plated with materials for enhanced adhesion to device dies and wires. The plating can comprise silver (Ag) plating that is selectively applied to PQFN leadframe 270, which is available from companies such as QPL Limited.

FIGS. 2A and 2B show that PQFN leadframe 270 is an etched leadframe, such as a half-etched leadframe. Portions of PQFN leadframe 270, which are unetched (e.g. not half-etched) are indicated in FIGS. 2A and 2B using dashed lines. Leadframe islands 280*a*, 280*b*, and 280*c* are examples of such unetched portions. For example, FIG. 2C shows bottom-side 286*b* of PQFN leadframe 270 (which also corresponds to a bottom-side of PQFN package 200). FIG. 2C further shows mold compound 265 of PQFN package 200, which covers etched portions of PQFN leadframe 270. Mold compound 265 can be a plastic that has a low flexural modulus, such as CEL9220ZHF10 (v79) available from Hitachi® Chemical. To provide resilience against package cracking, the height (or thickness) of PQFN package 200 as defined by mold compound 265 may be kept thin, such as 0.9 min or less.

I/O terminals 252, leadframe islands 280*a*, 280*b*, and 280*c* are unetched and are exposed through mold compound 265 on bottom-side 286b of PQFN leadframe 270 (which also corresponds to a bottom-side of PQFN package 200). As such, I/O terminals 252 and leadframe islands 280a, 280b, and 280c are exposed on bottom-side 286b of PQFN leadframe 270 for high electrical conductivity and/or thermal dissipation. Portions of common IC die pad 272, common drain/collector pad 276, W-phase output pad 274a, V-phase output pad 274b, and U-phase output pad 274c are also exposed on bottom-side 286b of PQFN package 200 for high electrical conductivity and/or thermal dissipation. By providing, for example, a (PCB) with matching lands, the exposed features can optionally be exploited. The exposed areas of PQFN leadframe 270 can be plated, for example, with Tin (Sn) or another metal or metal alloy.

In the present implementation, control circuit 112 and driver circuit 114 of FIG. 1B are in common IC 202. Thus, common IC 202 is configured to drive and control switching of U-phase power switches 204a and 204b, V-phase power switches 206a and 206b, and W-phase power switches 208a and 208b, which correspond to multi-phase power inverter 110 in FIG. 1A. Common IC 202 is situated on PQFN leadframe 270 and more particularly, common IC 202 is situated on common IC die pad 272 of PQFN leadframe 270. Thus, in the present implementation, driver circuit 114 and control circuit 112 are situated on a same die pad of PQFN leadframe 270. Common IC 202, U-phase power switches 204a and 204b, V-phase power switches 206a and 206b, and W-phase power switches 208a and 208b are interconnected utilizing wirebonds and PQFN leadframe 270. It is noted that any particular connection shown can utilize one or more wirebonds.

FIG. 2B shows that wirebonds, such as wirebond 288a electrically and mechanically connect common IC 202 to VSP terminal 252b, AADV terminal 252c, PG terminal 252d, DIR terminal 252e, PGSEL terminal 252f, PAR1 terminal 252g, PAR2 terminal 252h, RX terminal 252i, TX terminal 252j, XTAL terminal, 252k, CLK terminal 252l, VSS terminal 252m, and VCC terminal 252u, and to respective gates of U-phase power switches 204a and 204b, V-phase power switches 206a and 206b, and W-phase power switches 208a and 208b.

Wirebond 288a and similarly depicted wirebonds in FIG. 2B can include, for example, 1.3 mil diameter G1 type Gold (Au) wires. Thicker wires can be utilized for power connections, such as wirebonds 290a, 290b, 290c, 290d, 290e, and 290f (also referred to as "wirebonds 290"). Wirebonds 290 can be, for example, 2.0 mil diameter copper (Cu) wires, such as Maxsoft® LD wires available from Kulicke & Soffa®. Wirebonds 290 can be bonded using bond stitch on ball (BSOB) bonding. As shown in FIG. 2B, multiple wirebonds, such as two wirebonds, can be in parallel with wirebonds 290 to for additional current handling.

FIG. 2B shows that U-phase power switches 204a and 204b, V-phase power switches 206a and 206b, W-phase power switches 208a and 208b, and common IC 202 are electrically and mechanically connected to PQFN leadframe 270. This can be accomplished utilizing solder or conductive adhesive, such as silver filled QMI 529HT available from Henkel Corporation.

As shown in FIG. 2B, U-phase power switch 204b, V-phase power switch 206b, and W-phase power switch 208b are situated on PQFN leadframe 270 along edge 283a of PQFN package 200. W-phase power switch 208b is situated on W-phase output pad 274a. More particularly, drain 292a of W-phase power switch 208b is situated on W-phase output pad 274a. Similarly, V-phase power switch 206b is situated on V-phase output pad 274b. More particularly, drain 292b of V-phase power switch 206b is situated on V-phase output pad 274b. Also, U-phase power switch 204b is situated on U-phase output pad 274c. More particularly, drain 292c of U-phase power switch 204b is situated on U-phase output pad 274c. Thus, U-phase power switch 204b, V-phase power switch 206b, and W-phase power switch 208b are individually coupled to respective die pads of PQFN leadframe 270. As such, W-phase output pad 274a can correspond to SW3 terminal 252q of PQFN package 200, V-phase output pad 274b can correspond to SW2 terminal 252p of PQFN package 200, and U-phase output pad 274c can correspond to SW1 terminal 252o of PQFN package 200, as shown in FIG. 2B.

Also shown in FIG. 2B, U-phase power switch 204a, V-phase power switch 206a, and W-phase power switch 208a are situated on PQFN leadframe 270 along edge 283b of PQFN package 200, which intersects edge 283a. U-phase power switch 204a, V-phase power switch 206a, and W-phase power switch 208a are situated on common drain/collector pad 276 of PQFN leadframe 270. More particularly, drain 292d of U-phase power switch 204a, drain 292e of V-phase power switch 206a, and drain 292f of W-phase power switch 208a are situated on common drain/collector pad 276 of PQFN leadframe 270. Thus, common drain/collector pad 276 can correspond to VBUS terminal 252a of PQFN package 200, as shown in FIG. 2B.

Drain 292d of U-phase power switch 204a, drain 292e of V-phase power switch 206a, and drain 292f of W-phase power switch 208a can be connected to common drain/collector pad 276 through conductive adhesive and/or plating of PQFN leadframe 270. The conductive adhesive can include silver filled adhesive such as QMI 529HT. Other dies in PQFN package 200 can similarly be connected to PQFN leadframe 270.

U-phase power switch 204b, V-phase power switch 206b, and W-phase power switch 208b are coupled respectively to U-phase power switch 204a, V-phase power switch 206a, and W-phase power switch 208a through PQFN leadframe 270.

As shown in FIG. 2B, U-phase, V-phase, and W-phase power switches 204b, 206b, and 208b are each situated on PQFN leadframe 270 and are also respectively connected to U-phase, V-phase, and W-phase output pads 274c, 274b, and 274a. U-phase, V-phase, and W-phase power switches 204b, 206b, and 208b are also respectively connected to U-phase, V-phase, and W-phase output strips 278a, 278b, and 278c through U-phase, V-phase, and W-phase output pads 274c, 274b, and 274a.

In FIG. 2B, wirebond 290a electrically and mechanically connects source 294d of U-phase power switch 204a to PQFN leadframe 270. Source 294d is connected via wirebond 290a to leadframe island 280a of U-phase output strip 278a through, for example, plating of PQFN leadframe 270. U-phase output strip 278a then connects to drain 292c of U-phase power switch 204b through U-phase output pad 274c. Thus, source 294d is connected via wirebond 290a to leadframe island 280a of U-phase output strip 278a. As such, U-phase output 111a of FIG. 1A is connected to U-phase output strip 278a of PQFN leadframe 270, where U-phase output strip 278a is connected to U-phase output pad 274c of PQFN leadframe 270. By doing so, PQFN package 200 has significant flexibility in arranging wirebond 290a, and other wirebonds, such as wirebond 288b, while avoiding wire shorts due to wire crossing and achieving high electrical and thermal performance.

Similarly, wirebond 290b electrically and mechanically connects source 294e of V-phase power switch 206a to PQFN leadframe 270. Source 294e is connected via wirebond 290b to leadframe island 280b of V-phase output strip 278b through, for example, plating of PQFN leadframe 270. V-phase output strip 278b then connects to drain 292b of V-phase power switch 206b through V-phase output pad 274b. Thus, V-phase output 111b of FIG. 1A is connected to V-phase output strip 278b of PQFN leadframe 270, where V-phase output strip 278b is connected to V-phase output pad 274b of PQFN leadframe 270. As such, PQFN package 200 has significant flexibility in arranging wirebond 290b, and other wirebonds, such as wirebond 288c, while avoiding wire shorts due to wire crossing and achieving high electrical and thermal performance.

Also in FIG. 2B, wirebond 290c is electrically and mechanically connecting source 294f of W-phase power switch 208a to PQFN leadframe 270. More particularly, wirebond 290c electrically and mechanically connects source 294f of W-phase power switch 208a to W-phase output pad 274a on PQFN leadframe 270. Thus, W-phase output 111c of FIG. 1A is connected to W-phase output pad 274a of PQFN leadframe 270 with W-phase power switch 208b. As W-phase power switch 208b is adjacent to W-phase power switch 208a, source 294f of W-phase power switch 208a can be coupled to drain 292a of W-phase power switch 208b while easily avoiding wire shorts due to wire crossing and achieving high electrical and thermal performance.

Thus, multi-phase power inverter 110 of FIG. 1A can be included in common IC 202. Multi-phase power inverter 110 includes U-phase output 111a connected to U-phase output strip 278a and U-phase output pad 274c using at least wirebond 288b. Furthermore, multi-phase power inverter 110 includes V-phase output 111b connected to V-phase output strip 278b and V-phase output pad 274b using at least wirebond 288c. Multi-phase power inverter 110 also includes W-phase output 111c connected to W-phase output strip 278c and W-phase output pad 274a using at least wirebond 288d.

The aforementioned can be accomplished without utilizing W-phase output strip 278c and/or leadframe island 280c. However, by utilizing W-phase output strip 278c, an additional SW3 terminal 252q can be provided at edge 283c of PQFN package 200. Furthermore, leadframe island 280c can be exposed on bottom-side 286b of PQFN package 200 for high electrical conductivity and/or thermal dissipation. This configuration does not significantly impact flexibility in arranging wirebonds in PQFN package 200.

Also in PQFN package 200, common IC 202 is connected to U-phase output strip 278a, V-phase output strip 278b, and W-phase output strip 278c of PQFN leadframe 270. Common IC 202 is connected to U-phase output strip 278a and V-phase output strip 278b through respective wirebonds 288b and 288c. Furthermore, common IC 202 is connected to W-phase output strip 278c through wirebonds 288d, 290c, and W-phase output pad 274a.

Common IC 202 is also connected to U-phase output pad 274c, V-phase output pad 274b, and W-phase output pad 274a of PQFN leadframe 270. Common IC 202 is connected to U-phase output pad 274c through wirebond 288b and U-phase output strip 278a. Furthermore, common IC 202 is connected to V-phase output pad 274b through wirebond 288c and V-phase output strip 278b. Common IC 202 is connected to W-phase output pad 274a through wirebonds 288d and 290c.

In PQFN package 200, wirebond 288b couples driver circuit 114 (e.g. U-phase driver 144a) and U-phase output strip 278a of PQFN leadframe 270 at leadframe island 280a. U-phase output 111a of FIG. 1A is situated on leadframe island 280a of PQFN leadframe 270. Thus, U-phase driver 144a of FIG. 1A is coupled to U-phase output 111a of multi-phase power inverter 110, where U-phase output 111a is situated on leadframe island 280a (and/or U-phase output strip 278a) of PQFN leadframe 270.

Similarly, wirebond 288c couples driver circuit 114 (e.g. V-phase driver 146a) and V-phase output strip 278b of PQFN leadframe 270 at leadframe island 280b. V-phase output 111b of FIG. 1A is situated on leadframe island 280b of PQFN leadframe 270. Thus, V-phase driver 146a of FIG. 1A is coupled to V-phase output 111b of multi-phase power inverter 110, where V-phase output 111b is situated on leadframe island 280b (and/or V-phase output strip 278b) of PQFN leadframe 270.

It is noted that PQFN package 200 can include leadframe islands 280a, 280b, and/or 280c without U-phase, V-phase, and W-phase output strips 278a, 278b, and/or 278c. For example, leadframe island 280b can be connected to V-phase output pad 274b through a trace on a PCB. It is further noted that PQFN package 200 can include U-phase, V-phase, and W-phase output strips 278a, 278b, and/or 278c without leadframe islands 280a, 280b, and/or 280c. However, having U-phase, V-phase, and W-phase output strips 278a, 278b, and 278c with leadframe islands 280a, 280b, and 280c can offer significant flexibility in arranging wirebonds in PQFN package 200 while achieving high electrical and thermal performance.

Also in the present implementation, wirebond 288d couples driver circuit 114 (e.g. W-phase driver 148a) and source 294f of W-phase power switch 208a. Wirebond 288d is a direct electrical connection between common IC 202 and source 294f. W-phase driver 148a of FIG. 1A is thereby coupled to W-phase output 111c of multi-phase power inverter 110. It is noted that in some implementations, wirebond 288b can couple driver circuit 114 (e.g. W-phase driver 148a) and W-phase output strip 278c of PQFN leadframe 270 at leadframe island 280c. However, this may increase the footprint of PQFN package 200.

PQFN package 200 further includes wirebonds 288f, 288g, and 288h respectively coupling the common IC (e.g. driver circuit 114) to VB1, VB2, and VB3 terminals 252r, 252s, and 252t of PQFN package 200. Bootstrap capacitors can be respectively coupled from VB1, VB2, and VB3 terminals 252r, 252s, and 252t to SW1 terminal 252o, SW2 terminal 252p, and SW3 terminal 252q so as to power U-phase, V-phase, and W-phase drivers 144a, 146a, and 148a.

PQFN package 200 includes a logic ground of PQFN leadframe 270 coupled to a support logic circuit of common IC 202. The logic ground of PQFN leadframe 270 includes VSS terminal 252m. At least wirebond is electrically and mechanically connecting VSS terminal 252m of PQFN leadframe 270 to common IC 202 and more particularly, is connecting VSS terminal 252m of PQFN leadframe 270 to the support logic of common IC 202.

PQFN package 200 further includes a power stage ground of PQFN leadframe 270 coupled to sources 294c, 294b, and 294a of U-phase power switch 204b, V-phase power switch 206b, and W-phase power switch 208b. The power stage ground of PQFN leadframe 270 includes VCOM terminal 252n. In FIG. 2B, at least wirebond 290f is electrically and mechanically connecting VCOM terminal 252n of the power stage ground of PQFN leadframe 270 to source 294c of U-phase power switch 204b. At least wirebond 290e is electrically and mechanically connecting source 294c of U-phase power switch 204b to source 294b of V-phase power switch 206b. Also, at least wirebond 290d is electrically and mechanically connecting source 294b of V-phase power switch 206b to source 294a of W-phase power switch 208b. Thus, sources 294a, 294b, and 294c of U-phase power switch 204b, V-phase power switch 206b, and W-phase power switch 208b (i.e. low side power switches) are coupled together within PQFN package 200.

In other implementations, PQFN package 200 is an open source/emitter PQFN package, in which sources 294a, 294b, and 294c are not electrically connected to each other within PQFN package 200. For example, wirebonds, such as wirebonds 290 can electrically and mechanically connect sources 294a, 294b, and 294c to respective current source terminals of PQFN package 200.

In the present implementation, the power stage ground (VCOM) of PQFN leadframe 270 is coupled to driver circuit 114 (e.g. U-phase, V-phase, and W-phase drivers 144b, 146b, and 148b in FIG. 1B) of common IC 202. Wirebond 288e is connecting source 294c of U-phase power switch 204b to U-phase, V-phase, and W-phase drivers 144b, 146b, and 148b of common IC 202. Common IC 202 is thereby connected to sources 294c, 294b, and 294a of U-phase, V-phase, and W-phase power switches 204b, 206b, and 208b within PQFN package 200. In some implementations, common IC 202 optionally has ground 294, which is situated on common IC die pad 272 of PQFN leadframe 270. Ground 294 can be the power stage ground and/or the logic ground. In the implementation shown, where ground 294 is the logic stage ground, the wirebond for VSS terminal 252m may be excluded.

Thus, as described above with respect to FIGS. 1A through 1C and 2A through 2C, in accordance with various implementations, PQFN packages can include a multi-phase power inverter, a control circuit, and a driver circuit, which are each situated on a PQFN leadframe of the PQFN package. By including the driver circuit and the control circuit in the PQFN package, the PQFN package can simplify circuit design, reduce costs, and provide greater efficiency and improved performance, amongst other advantages. Furthermore, including the control circuit and the driver circuit on a common IC, may enhance these advantages.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described above, but many rearrangements, modifications, and substitutions are possible without departing from the scope of the present disclosure.

The invention claimed is:

1. A power quad flat no-lead (PQFN) package comprising:
U-phase and W-phase power switches situated on a leadframe and respectively connected to a U-phase output strip and a W-phase output pad of said leadframe;
a common integrated circuit (IC) comprising a driver circuit and a control circuit, said common IC being connected to said U-phase output strip and to said W-phase output pad of said leadframe;
wherein said U-phase output strip extends from a U-phase output pad at a first edge of said PQFN package to a second edge on an opposite side of said PQFN package.

2. The PQFN package of claim 1, further comprising a V-phase power switch situated on said leadframe, said V-phase power switch connected to a V-phase output strip of said leadframe.

3. The PQFN package of claim 1, further comprising at least one wirebond connecting said common IC to said U-phase output strip.

4. The PQFN package of claim 1 wherein said W-phase power switch is situated on said W-phase output pad.

5. The PQFN package of claim 1, wherein said W-phase output pad is connected to a W-phase output strip of said leadframe.

6. The PQFN package of claim 1, further comprising a common supply voltage terminal for said driver circuit and said control circuit.

7. The PQFN package of claim 5, further comprising a leadframe island situated on said W-phase output strip.

8. The PQFN package of claim 7 wherein said leadframe island is exposed on a bottom-side of said PQFN package.

9. The PQFN package of claim 1, further comprising at least one wirebond connected between said common IC and a source of said U-phase power switch.

10. The PQFN package of claim 1, wherein said U-phase and W-phase power switches comprise group III-V transistors.

11. The PQFN package of claim 1, wherein said PQFN package has a footprint of greater than 12 mm by 12 mm.

12. The PQFN package of claim 1, wherein said PQFN package has a footprint of less than 12 mm by 12 mm.

13. A power quad flat no-lead (PQFN) package comprising:
a multi-phase power inverter situated on a leadframe, said multi-phase power inverter including a U-phase output connected to a U-phase output strip of said leadframe and a W-phase output connected to a W-phase output pad of said leadframe;
a common integrated circuit (IC) comprising a driver circuit and a control circuit, said common IC being connected to said U-phase output strip and to said W-phase output pad of said leadframe;
wherein said U-phase output strip extends from a U-phase output pad at a first edge of said PQFN package to a second edge on an opposite side of said PQFN package.

14. The PQFN package of claim 13, wherein said multi-phase power inverter further includes a V-phase output connected to a V-phase output strip of said leadframe.

15. The PQFN package of claim 13, further comprising at least one wirebond connecting said common IC to said U-phase output strip.

16. The PQFN package of claim 13, wherein said W-phase output pad is connected to a W-phase output strip of said leadframe.

17. The PQFN package of claim 13, further comprising a common supply voltage terminal for said driver circuit and said control circuit.

18. The PQFN package of claim 13, further comprising at least one wirebond connected between said common IC and a source of said multi-phase power inverter.

19. A power quad flat no-lead (PQFN) package comprising:
U-phase and V-phase power switches situated on a leadframe and respectively connected to a U-phase output strip and a V-phase output strip of said leadframe;
a common integrated circuit (IC) comprising a driver circuit and a control circuit, said common IC being connected to said U-phase output strip and to said V-phase output strip of said leadframe;

wherein said U-phase output strip extends from a U-phase output pad at a first edge of said PQFN package to a second edge on an opposite side of said PQFN package.

20. The PQFN package of claim 19, further comprising at least one wirebond connecting said common IC to said U-phase output strip.

21. The PQFN package of claim 19, further comprising at least one wirebond connecting said common IC to said V-phase output strip.

22. The PQFN package of claim 19, further comprising a W-phase power switch situated on a W-phase output pad of said leadframe.

23. The PQFN package of claim 19, further comprising a W-phase power switch situated on said leadframe, said W-phase power switch connected to a W-phase output strip of said leadframe.

* * * * *